United States Patent
Li

(10) Patent No.: US 11,137,676 B2
(45) Date of Patent: Oct. 5, 2021

(54) PHOTOMASK AND EXPOSURE SYSTEM

(71) Applicants: HKC Corporation Limited, Guangdong (CN); Chongqing HKC Optoelectronics Technology Co., Ltd., Chongqing (CN)

(72) Inventor: Zeyao Li, Guangdong (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 209 days.

(21) Appl. No.: 16/282,331

(22) Filed: Feb. 22, 2019

(65) Prior Publication Data

US 2020/0103748 A1  Apr. 2, 2020

Related U.S. Application Data

(63) Continuation of application No. PCT/CN2018/113301, filed on Nov. 1, 2018.

(30) Foreign Application Priority Data

Sep. 30, 2018 (CN) .......................... 201821612408.4

(51) Int. Cl.
  *G03F 1/54* (2012.01)
  *G02F 1/1339* (2006.01)
  *G03F 1/38* (2012.01)
  *G03F 7/20* (2006.01)
  *G03F 1/56* (2012.01)

(52) U.S. Cl.
  CPC .................. *G03F 1/38* (2013.01); *G03F 1/54* (2013.01); *G03F 1/56* (2013.01); *G03F 7/70058* (2013.01); *G02F 1/13392* (2013.01)

(58) Field of Classification Search
  CPC ..... G03F 1/38; G03F 1/54; G03F 1/56; G03F 7/70283; G02F 1/13392
  USPC ............................................................ 430/5
  See application file for complete search history.

(56) References Cited

U.S. PATENT DOCUMENTS 6,071,652 A     6/2000  Feldman et al.
2020/0081344 A1* 3/2020  Ishikawa ............. H01L 27/3246

FOREIGN PATENT DOCUMENTS

| CN | 102819180 A | 12/2012 |
|---|---|---|
| CN | 102819181 A | 12/2012 |
| CN | 104155843 A | 11/2014 |
| JP | 2001033790 A | 2/2001 |
| JP | 2002229040 A | 8/2002 |

(Continued)

OTHER PUBLICATIONS

Computer-generated translation of JP 2002-229040 (Feb. 2002). (Year: 2002).*

(Continued)

*Primary Examiner* — John A McPherson

(57) ABSTRACT

The present application discloses a photomask and an exposure system, the photomask comprising a completely transparent region and a completely shading region disposed around the periphery of the completely transparent region, and a shading region is disposed in the completely transparent region, and a light transmittance of the shading region is defined as T, 0≤T<100%.

13 Claims, 3 Drawing Sheets

(56) References Cited

FOREIGN PATENT DOCUMENTS

JP   2007-279192   * 10/2007
WO   WO 2018/116988   * 6/2018

OTHER PUBLICATIONS

Computer-generated translation of JP 2007-279192 (Oct. 2007). (Year: 2007).*

* cited by examiner

PHOTOMASK AND EXPOSURE SYSTEM

CROSS REFERENCE TO RELATED APPLICATIONS

The present application is a Continuation Application of PCT Application No. PCT/CN2018/113301 filed on Nov. 1, 2018, which claims the benefit of Chinese Patent Application No. 201821612408.4, filed on Sep. 30, 2018, which is incorporated herein by reference in its entirety.

FIELD OF THE DISCLOSURE

The present application relates to the field of liquid crystal display technology, in particular, to a photomask and an exposure system using the same.

BACKGROUND OF THE DISCLOSURE

A liquid crystal panel of a liquid crystal display includes an array film (Thin Film Transistor), a liquid crystal layer, and a color filter (Color Filter), and a plurality of supporting spacers are disposed between the color filter and the array substrate to ensure the thickness of the liquid crystal box. Further, in order to ensure that the liquid crystal box has a large enough liquid crystal redundancy to resist the effects of temperature changes and pressure changes on the liquid crystal box, a part of some of the spacers will be configured as the main spacer, and the other part will be configured as the auxiliary spacer in the design of the liquid crystal panel, and a sufficient section difference between the main spacer and the auxiliary spacer is also required. However, in the actual process of spacers, the free end surface of the spacer, that is, the end surface of the spacer for abutting the array substrate, is not flat, but is in the form of a sphere. At this time, due to the influence of the spherical sliding, the actually acting spacer will be much smaller than the design value, so that the box thickness of the liquid crystal box is abnormal, which affects the display quality.

SUMMARY OF THE DISCLOSURE

The main purpose of the present application is to provide a photomask for improving the flatness of the free end surface of the spacer and improving the stability of the spacer abutting the array substrate, thereby avoiding the abnormal thickness of the liquid crystal box and improving the display quality of the liquid crystal panel.

To achieve the above purpose, the photomask provided by the present application comprises a completely transparent region and a completely shading region disposed around the periphery of the completely transparent region, and a shading region is disposed in the completely transparent region, and a light transmittance of the shading region is defined as T, $0 \leq T < 100\%$.

Optionally, an outer contour shape of the shading region is the same as an outer contour shape of the completely transparent region.

Optionally, a center of the shading region is disposed to coincide with a center of the completely transparent region.

Optionally, the minimum distance between the outer contour shape of the shading region and the outer contour shape of the completely transparent region is 2 μm to 10 μm.

Optionally, the shading region includes a plurality of sub-shading regions, and the plurality of sub-shading regions are spaced apart, the light transmittance of each of the sub-shading regions being greater than or equal to 0 and less than 100%.

Optionally, among the plurality of sub-shading regions, the center of one of the sub-shading regions coincides with the center of the completely transparent region, and the remaining sub-shading regions are spaced apart around the outer contour of the completely transparent region.

Optionally, the ratio of the area of the shading region to the area of the completely transparent region is 10% to 60%.

Optionally, the light transmittance of the shading region is 0 to 60%.

Optionally, the shading region is a resin material.

The present application further provides an exposure system comprising an exposure machine and a photomask, the photomask including a completely transparent region and a completely shading region disposed around the periphery of the completely transparent region, and a shading region is disposed in the completely transparent region, and a light transmittance of the shading region is defined as T, $0 \leq T < 100\%$, the photomask being disposed at a light exit of the exposure machine.

Optionally, an outer contour shape of the shading region is the same as an outer contour shape of the completely transparent region.

Optionally, a center of the shading region is disposed to coincide with a center of the completely transparent region.

Optionally, the minimum distance between the outer contour shape of the shading region and the outer contour shape of the completely transparent region is 2 μm to 10 μm.

Optionally, the shading region includes a plurality of sub-shading regions, and the plurality of sub-shading regions are spaced apart, the light transmittance of each of the sub-shading regions being greater than or equal to 0 and less than 100%.

Optionally, among the plurality of sub-shading regions, the center of one of the sub-shading regions coincides with the center of the completely transparent region, and the remaining sub-shading regions are spaced apart around the outer contour of the completely transparent region.

Optionally, the ratio of the area of the shading region to the area of the completely transparent region is 10% to 60%.

Optionally, the light transmittance of the shading region is 0 to 60%.

Optionally, the shading region is a resin material.

When the photomask of the present application is applied to a photolithography process in a liquid crystal panel process, since an opaque or incompletely transparent region is added to the completely transparent region originally used for exposing to form the spacer, the boundary between the regions of the photoresist material under the photomask that have different illumination intensity during the exposure process is increased from the original one to the current two, that is, there are two regions having different exposure levels in the region defined by the boundary located at the outer side—the peripheral region and the intermediate region. At this time, since the exposure level of the intermediate region is weaker than the exposure level of the peripheral region, the degree of bonding of molecules in the photoresist material in the intermediate region is lower than that in the peripheral region, so that the free end of the photoresist material in the intermediate region during the development process is more etched than that of the peripheral region, that is, the spherical surface of the free end of the spacer is effectively reduced, thereby improving the flatness of the free end surface of the spacer, improving the stability of the spacer abutting the array substrate, avoiding the abnormal thickness of the liquid crystal box, and improving the display quality of the liquid crystal panel.

Further, in the case where the array substrate corresponding to the spacer has a recess, when the liquid crystal panel is subjected to external pressure, due to the flatness of the free end surface of the spacer and improvement for the stability of the spacer abutting the array substrate, the ratio of the main and auxiliary spacers that actually function may also match the design values, thereby further avoiding the abnormal thickness of the liquid crystal box and improving the display quality of the liquid crystal panel.

BRIEF DESCRIPTION OF THE DRAWINGS

In order to illustrate the technical schemes in the embodiments of the present application or in the prior art more clearly, the drawings which are required to be used in the description of the embodiments or the prior art are briefly described below. It is obvious that the drawings described below are only some embodiments of the present application. It is apparent to those of ordinary skill in the art that other drawings may be obtained based on the structures shown in accompanying drawings without inventive effort.

LABELING DESCRIPTION OF THE DRAWINGS

Figure 1:
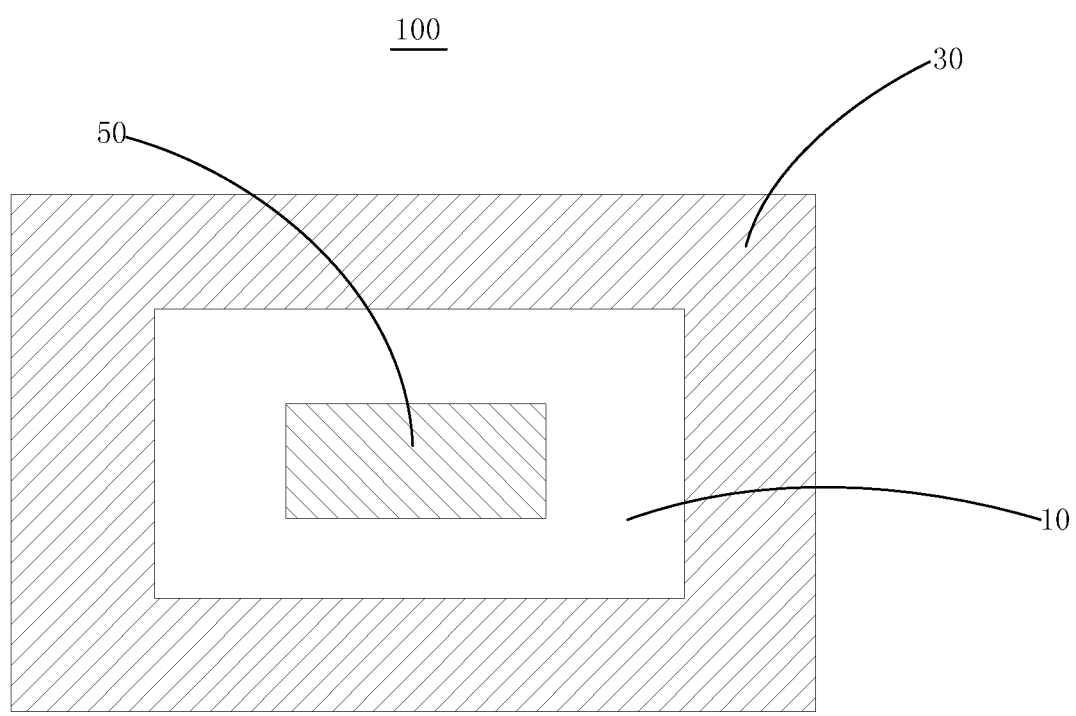
FIG. 1 is a view of a photomask according to an embodiment of the present application.

| Labeling | Name | Labeling | Name |
|---|---|---|---|
| 100 | Photomask | 50 | Shading region |
| 10 | Completely transparent region | 51 | Sub-shading region |
| 30 | Completely shading region | | |

With reference to the drawings, the implement of the object, features and advantages of the present application will be further illustrated in conjunction with embodiments.

DETAILED DESCRIPTION OF THE EMBODIMENTS

The technical solutions in the embodiments of the present application will be clearly and completely described hereafter in connection with the embodiments of the present application. It is apparent that the described embodiments are just a part of the embodiments of the present application, but not the whole. Based on the embodiments of the present application, all the other embodiments obtained by that of ordinary skill in the art without inventive effort are within the scope of the present application.

It should be noted that all directional indications (such as up, down, left, right, front, back, . . . ) in the embodiments of the present application are only used to explain the relative positional relationship, motion situation and the like between components in a certain posture (as shown in the drawings), if the specific posture changes, the directional indication shall also change accordingly.

In addition, the descriptions of "first", "second" and the like in the present application are used for the purpose of description only, and are not to be construed as indicating or implying their relative importance or implicitly indicating the number of technical features indicated. Thus, features defined with "first", "second" may include at least one such feature, either explicitly or implicitly. In the description of the present application, the meaning of "a plurality" is at least two, such as two, three, etc., unless specifically defined otherwise.

In the present application, terms like "connected", "fixed" should be comprehended broadly unless otherwise specifically limited, for example, "fixed" may be connected securely, also be connected removably or integrally; it may be connected mechanically, also be connected electrically; it may be connected directly, also through a medium indirectly; it may be the internal communication of two elements or the interaction of two elements, unless explicitly defined otherwise. The specific meaning of the terms in the present application may be understood by those of ordinary skill in the art due to certain situations.

In addition, the technical solutions between the various embodiments of the present application may be combined with each other, provided that those skilled in the art can implement it, and when the combination of the technical solutions is contradictory or impossible to implement, it should be considered that the combination of these technical solutions does not exist, nor is it within the scope of protection required by this application.

The present application provides a photomask 100 applied for improving the flatness of the free end surface of the spacer and improving the stability of the spacer abutting the array substrate during the manufacturing process of the liquid crystal panel, thereby avoiding the abnormal thickness of the liquid crystal box and improving the display quality of the liquid crystal panel.

The specific structure of the photomask 100 will be described below.

As shown in FIG. 1, in an embodiment of the photomask 100 of the present application, the photomask 100 comprises a completely transparent region 10 and a completely shading region 30 disposed around the periphery of the completely transparent region 10, and a shading region 50 is disposed in the completely transparent region 10, and a light transmittance of the shading region 50 is defined as T, $0 \leq T < 100\%$.

In the present embodiment, the completely transparent region 10 is configured in a rectangular shape with a light transmittance of 100%, and the emitted light of the exposure machine may completely penetrate this region. The completely shading region 30 is configured in a loop shape, and its outer contour is also configured in a rectangular shape. The completely shading region 30 surrounds the periphery of the completely transparent region 10 with a light transmittance of 0, and the emitted light of the exposure machine is completely inaccessible to this region.

Further, the shading region 50 disposed in the completely transparent region 10 is also configured in a rectangular shape with a light transmittance of T, $0 \leq T < 100\%$. It is understood that when $0 < T < 100\%$, the shading region 50 is a region through which the emitted light of the exposure machine may partially penetrate, and at this time, a part of the emitted light of the exposure machine may penetrate the region. When T=0, the shading region 50 is a region completely shading the emitted light of the exposure machine, and at this time, the emitted light of the exposure machine may not completely penetrate the region.

In this way, when the above photomask 100 is applied to a photolithography process in a liquid crystal panel process, since an opaque or incompletely transparent shading region 50 is added to the completely transparent region 10 originally used for exposing to form the spacer, the boundary between the regions of the photoresist material under the photomask 100 that have different illumination intensity during the exposure process is increased from the original one to the current two, that is, there are two regions having different exposure levels in the region defined by the boundary located at the outer side—the peripheral region and the intermediate region. At this time, since the exposure level of the intermediate region is weaker than the exposure level of the peripheral region, the degree of bonding of molecules in the photoresist material in the intermediate region is lower than that in the peripheral region, so that the free end of the photoresist material in the intermediate region during the development process is more etched than that of the peripheral region, that is, the spherical surface of the free end of the spacer is effectively reduced, thereby improving the flatness of the free end surface of the spacer, improving the stability of the spacer abutting the array substrate, avoiding the abnormal thickness of the liquid crystal box, and improving the display quality of the liquid crystal panel.

Further, in the case where the array substrate corresponding to the spacer has a recess, when the liquid crystal panel is subjected to external pressure, due to the flatness of the free end surface of the spacer and improvement for the stability of the spacer abutting the array substrate, the ratio of the main and auxiliary spacers that actually function may also match the design values, thereby further avoiding the abnormal thickness of the liquid crystal box and improving the display quality of the liquid crystal panel.

As shown in FIG. 1, in an embodiment of the photomask 100 of the present application, an outer contour shape of the shading region 50 is the same as an outer contour shape of the completely transparent region 10.

In the present embodiment, the outer contour of the shading region 50 and the outer contour of the completely transparent region 10 are both configured in a rectangular shape, and each side of the outer contour of the shading region 50 is disposed in parallel with the corresponding side of the outer contour of the completely transparent region 10.

In this way, the uniformity of the width of the annular region which is completely transparent may be improved, so that the photoresist material under the shading region 50 may be located as much as possible in the middle of the free end of the spacer after exposure and development, thereby further effectively reducing the top of the spherical surface of the free end of the spacer and improving the flatness of the free end surface of the spacer.

As shown in FIG. 1, in an embodiment of the photomask 100 of the present application, a center of the shading region 50 is disposed to coincide with a center of the completely transparent region 10.

In the present embodiment, the intersection of the two diagonal lines of the rectangular shading region 50 coincides with the intersection of the two diagonal lines of the rectangular completely transparent region 10. Of course, when the shading region 50 and the completely transparent region 10 are both circular, the two circular centers are coincident.

In this way, the uniformity of the width of the annular region which is completely transparent may be further improved, so that the photoresist material under the shading region 50 may be further ensured to be located in the middle of the free end of the spacer after exposure and development, thereby further enhancing effective reduction for the top of the spherical surface of the free end of the spacer and further improving the flatness of the free end surface of the spacer.

In an embodiment of the photomask 100 of the present application, in order to further enhance the reduction effect of the shading region 50 on the spherical top of the free end of the spacer and improve the flatness of the free end surface of the spacer, the minimum distance between the outer contour shape of the shading region 50 and the outer contour shape of the completely transparent region 10 is 2 µm to 10 µm.

Figure 2:
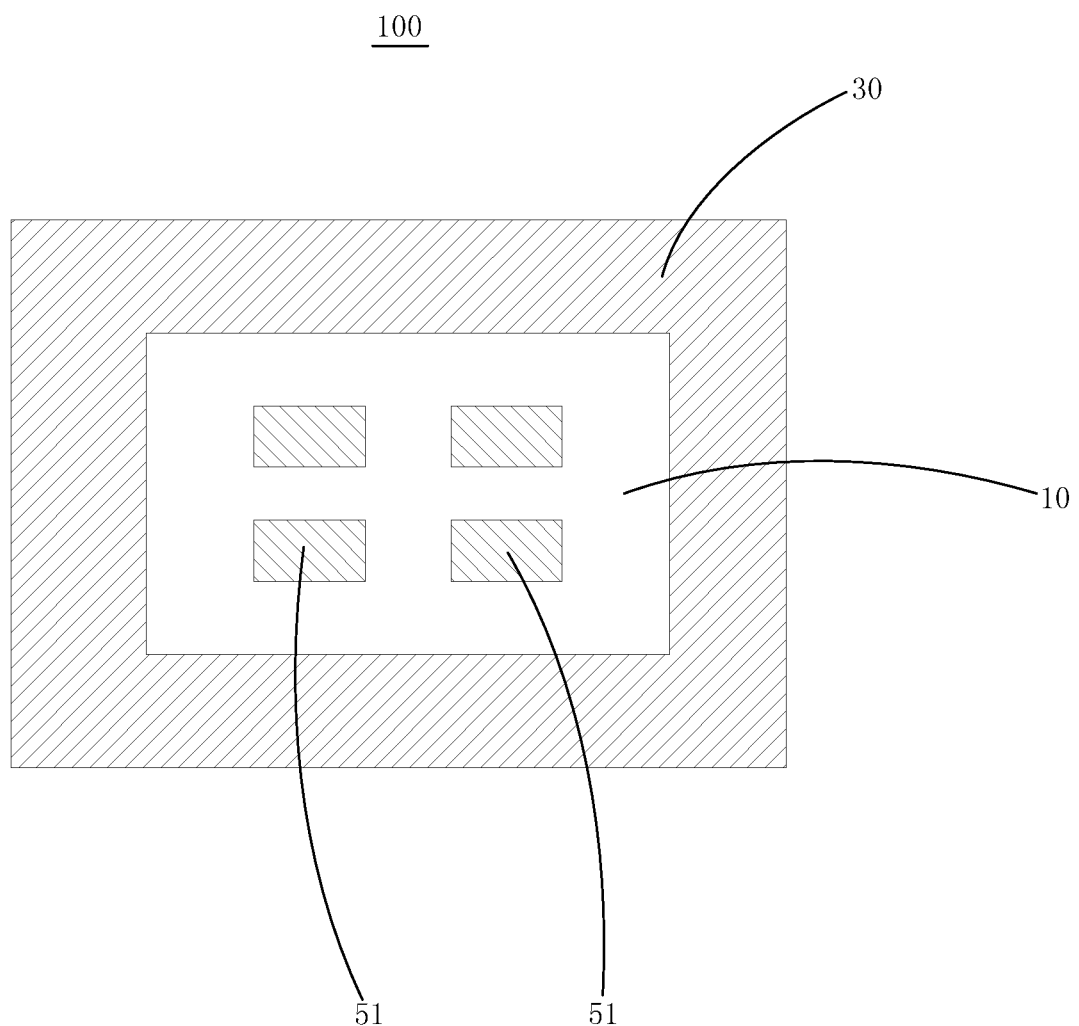
FIG. 2 is a view of a photomask according to another embodiment of the present application.

As shown in FIG. 2, in an embodiment of the photomask 100 of the present application, the shading region 50 includes a plurality of sub-shading regions 51, and the plurality of sub-shading regions 51 are spaced apart, the light transmittance of each of the sub-shading regions 51 being greater than or equal to 0 and less than 100%.

It is understood that when the light transmittance of the sub-shading region 51 is greater than 0 and less than 100%, the sub-shading region 51 is a region through which the emitted light of the exposure machine may partially penetrate, and a part of the emitted light of the exposure machine may penetrate the sub-shading region 51. When the light transmittance of the sub-shading region 51 is equal to 0, the sub-shading region 51 is a region completely shading the emitted light of the exposure machine, and at this time, the emitted light of the exposure machine may not completely penetrate the sub-shading region 51.

The plurality of sub-shading regions 51 are designed such that each of the sub-shading regions 51 is dispersed in the completely transparent region 10 such that the weakly exposed regions under each of the sub-shading regions 51 are dispersed, thereby making a plurality of weakened regions on the spherical surface of the free end of the spacer, further effectively improving the weakening effect on the spherical surface and improving the flatness of the free end surface of the spacer.

Figure 3:
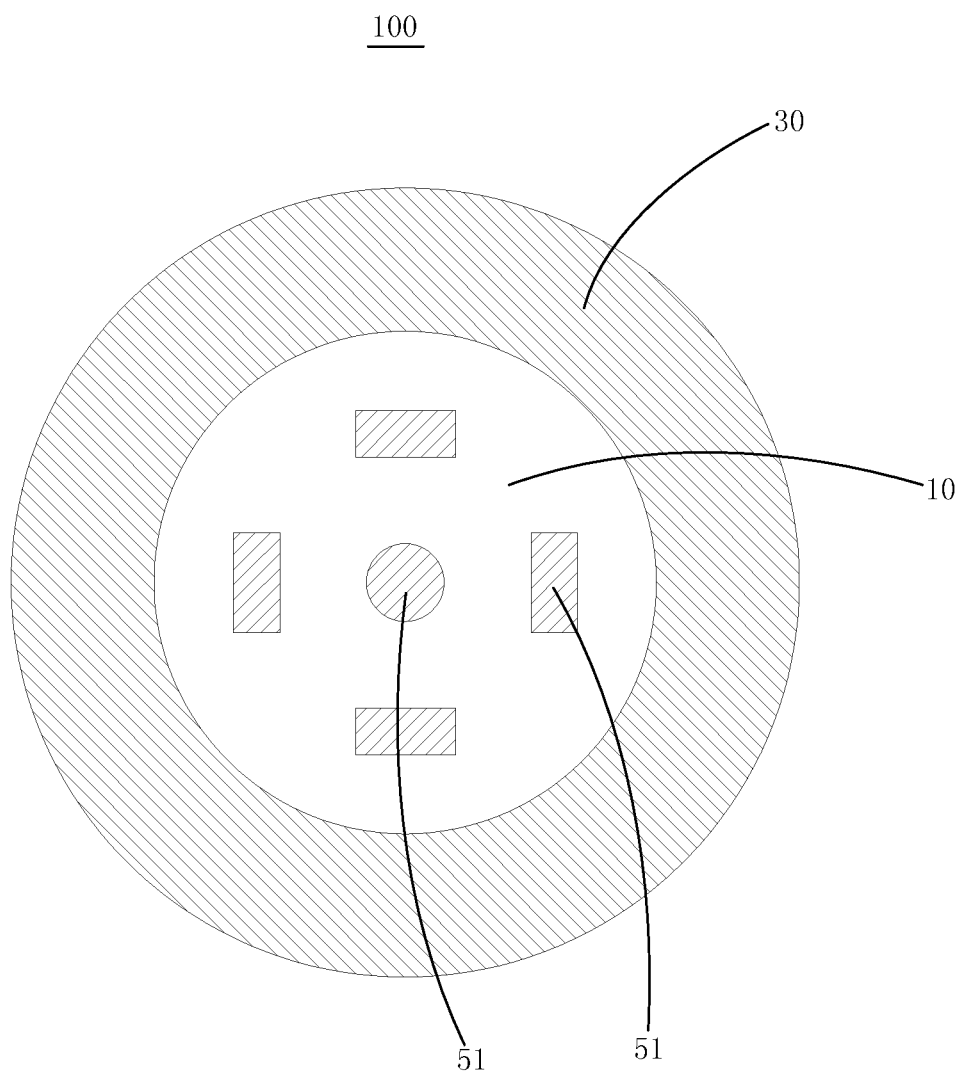
FIG. 3 is a view of a photomask according to a still another embodiment of the present application.

As shown in FIG. 3, in an embodiment of the photomask 100 of the present application, in order to further improve the uniformity of the dispersion of each weakly exposed region, improve the uniformity of dispersion for each weakened region on the spherical surface of the free end of the spacer, and ensure the top of the spherical surface to be effectively weakened, among the plurality of sub-shading regions 51, the center of one of the sub-shading regions 51 coincides with the center of the completely transparent region 10, and the remaining sub-shading regions 51 are spaced apart around the outer contour of the completely transparent region 10.

In an embodiment of the photomask 100 of the present application, in order to ensure the weakening effect of the shading region 50 on the spherical surface of the free end of the spacer, the ratio of the area of the shading region 50 to the area of the completely transparent region 10 is 10% to 60%. Specifically, if the ratio of the area is too small, the weakening effect of the shading region 50 on the spherical surface of the free end of the spacer may be significantly reduced, resulting in a low flatness of the free end of the spacer; if the ratio of the area is too large, the depression in the middle of the free end of the spacer is too large, and the flatness is also not high, which also causes the strength of the spacer itself to decrease significantly. Of course, it is understood that if the shading region 50 is composed of a plurality of sub-shading regions 51, the ratio of the total area of the plurality of sub-shading regions 51 to the area of the completely transparent region 10 is 10% to 60%.

In an embodiment of the photomask 100 of the present application, the light transmittance of the shading region 50 is 0 to 60%. In this way, the weakening effect of the shading area 50 on the spherical surface of the free end of the spacer may be effectively ensured, and the flatness of the free end surface of the spacer may be ensured. Specifically, if the light transmittance is too large, the spherical surface of the free end of the spacer is still obvious, and the flatness is not high.

In an embodiment of the photomask 100 of the present application, the shading region 50 is a resin material. At this time, the resin material may effectively adjust its light transmittance by adding some reflective substance or light absorbing substance, which is simple, convenient, and effective. Moreover, the resin material may make the coating more convenient, thereby effectively reducing the manufacturing difficulty of the photomask 100, improving the manufacturing efficiency, and improving the reliability of the photomask 100 of the present application.

In addition, it should be noted that the light transmittance is a physical quantity for characterizing the ability of light passing through the medium, and is a percentage of the luminous flux through the transparent or translucent body to the incident light flux.

When the light transmittance of the shading region 50 is designed to be 0, the shading region 50 may be prepared by selecting from the same material as the black matrix (i.e., the shading layer—BM layer).

When the light transmittance of the shading region 50 is designed to be greater than 0 and less than 100, the shading region 50 may be prepared by selecting a resin material, a glass material, or a plastic material.

The present application further provides an exposure system, which comprises an exposure system and the photomask 100 described above. The specific structure of the photomask 100 refers to the above embodiments. Since all the technical solutions of the foregoing embodiments are used in the exposure system, at least all technical effects brought by the technical solutions of the foregoing embodiments are included and are not described herein.

Among them, the photomask 100 is disposed at a light exit of the exposure machine.

Further, the photomask 100 is removably connected to the exposure machine for replacement of different photomasks 100. Specifically, the photomask 100 may be removably connected to the exposure machine by means of a screw connection, a snap connection or the like.

In addition, it should be noted that when the photomask 100 is applied to a photolithography process in a liquid crystal panel process, the following steps are included:

Step S1: providing a substrate, coating a negative photoresist layer on the substrate.

The negative photoresist layer has the following characteristics:

1. the region illuminated by the light is not removed by the developer, and the region that is not illuminated by the light may be removed by the developer;

2. different degrees of cross-linking reactions occur depending on the light energy received;

3. viscous flow occurs when the temperature exceeds the glass transition temperature; the viscous flow is an irreversible deformation;

4. the portion where the exposure level is low is more removed by the developer than the portion where the exposure level is high.

Step S2: providing the photomask 100 of the present application; the photomask 100 comprises a completely transparent region 10 and a completely shading region 30 disposed around the periphery of the completely transparent region 10, and a shading region 50 is disposed in the completely transparent region 10, and a light transmittance of the shading region 50 is defined as T, 0≤T<100%;

Step S3: exposing the negative photoresist layer by using the photomask 100 with ultraviolet light as a light source.

Step S4: developing the exposed negative photoresist layer.

Specifically, the negative photoresist layer exposed by the completely transparent region 10 may maintain a certain film thickness after development due to sufficient crosslinking reaction; the negative photoresist layer blocked by the shading region 50 may have a decreased film thickness after development due to insufficient crosslinking reaction, thereby effectively preventing the free end of the spacer from forming a spherical surface, that is, the spherical surface of the free end of the original spacer is transversely cut, and that is, the flatness of the free end of the currently formed spacer is obvious improved.

The above mentioned is only the optional embodiment of the present application, which does not limit the patent scope of the present disclosure, and any equivalent structure transformation made by using the specification and the drawings of the present disclosure or direct/indirect applications in other related technical fields should be contained in the scope of patent protection in a similar way.

What is claimed is:

1. A photomask, wherein the photomask comprises a completely transparent region and a completely shading region disposed around a periphery of the completely transparent region, and a shading region is disposed in the completely transparent region, and a light transmittance of the shading region is defined as T, 0≤T<100%; wherein the shading region includes a plurality of sub-shading regions, a light transmittance of each of the plurality of sub-shading regions being greater than or equal to 0 and less than 100%, one of the plurality of sub-shading regions has a center coinciding with a center of the completely transparent region and an outer contour shape being the same as an outer contour shape of the completely transparent region, and the remaining sub-shading regions are spaced apart around an outer contour of the completely transparent region.

2. The photomask according to claim 1, wherein a center of the shading region is disposed to coincide with the center of the completely transparent region.

3. The photomask according to claim 2, wherein a minimum distance between an outer contour shape of the shading region and the outer contour shape of the completely transparent region is 2 μm to 10 μm.

4. The photomask according to claim 3, wherein a ratio of an area of the shading region to an area of the completely transparent region is 10% to 60%.

5. The photomask according to claim 1, wherein a ratio of an area of the shading region to an area of the completely transparent region is 10% to 60%.

6. The photomask according to claim 1, wherein the light transmittance of the shading region is 0 to 60%.

7. The photomask according to claim 1, wherein the shading region is a resin material.

8. An exposure system, comprising an exposure machine and a photomask as recited in claim 1.

9. The exposure system according to claim 8, wherein a center of the shading region is disposed to coincide with the center of the completely transparent region.

10. The exposure system according to claim 9, wherein a minimum distance between an outer contour shape of the shading region and the outer contour shape of the completely transparent region is 2 μm to 10 μm.

11. The exposure system according to claim 8, wherein a ratio of an area of the shading region to an area of the completely transparent region is 10% to 60%.

12. The exposure system according to claim 8, wherein the light transmittance of the shading region is 0 to 60%.

13. The exposure system according to claim 8, wherein the shading region is a resin material.

* * * * *